(12) United States Patent
Yang et al.

(10) Patent No.: US 11,720,212 B2
(45) Date of Patent: Aug. 8, 2023

(54) DISPLAY DEVICE AND METHOD OF FABRICATING DISPLAY DEVICE

(71) Applicant: Samsung Display Co., Ltd., Yongin-si (KR)

(72) Inventors: Sung-Jin Yang, Cheonan-si (KR); Hyunsik Park, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/750,106

(22) Filed: May 20, 2022

(65) Prior Publication Data

US 2022/0276740 A1    Sep. 1, 2022

Related U.S. Application Data

(62) Division of application No. 17/187,114, filed on Feb. 26, 2021, now Pat. No. 11,385,747.

(30) Foreign Application Priority Data

May 22, 2020   (KR) .......................... 10-2020-0061651

(51) Int. Cl.
*H10K 71/00*    (2023.01)
*G06F 3/041*    (2006.01)
*G06F 3/044*    (2006.01)
*H10K 59/40*    (2023.01)

(52) U.S. Cl.
CPC .......... *G06F 3/0443* (2019.05); *G06F 3/0446* (2019.05); *G06F 2203/04103* (2013.01); *H10K 59/40* (2023.02); *H10K 71/851* (2023.02)

(58) Field of Classification Search
None
See application file for complete search history.

(56) References Cited

U.S. PATENT DOCUMENTS

| 10,719,152 B2 | 7/2020 | Lee et al. |
| 2011/0057893 A1 | 3/2011 | Kim et al. |
| 2019/0129539 A1 | 5/2019 | Kim et al. |

FOREIGN PATENT DOCUMENTS

| CN | 113380855 A | * | 9/2021 | ......... H01L 51/5237 |
| KR | 10-1082293 B1 | | 11/2011 | |
| KR | 10-2016-0082883 A | | 7/2016 | |
| KR | 10-2018-0107613 A | | 10/2018 | |

* cited by examiner

*Primary Examiner* — Duane N Taylor, Jr.
(74) *Attorney, Agent, or Firm* — Lewis Roca Rothgerber Christie LLP

(57) ABSTRACT

A display device may include a display panel and an input sensor thereon. The input sensor may include an active region and a pad region adjacent to each other and may include a sensing electrode overlapped with the active region to sense an input, a sensing pad overlapped with the pad region, and a sensing line electrically connecting the sensing electrode to the sensing pad. The sensing pad may include a pad portion and an edge portion, which is extended from the pad portion to an edge of the input sensor in a plan view. Each of the pad portion and the edge portion may include a first pad and a second pad, which is at least partially overlapped with the first pad. In the edge portion, at least a portion of the second pad may be spaced apart from the first pad, in a plan view.

7 Claims, 19 Drawing Sheets

DISPLAY DEVICE AND METHOD OF FABRICATING DISPLAY DEVICE

CROSS-REFERENCE TO RELATED APPLICATIONS

This application is a divisional of U.S. patent application Ser. No. 17/187,114, filed on Feb. 26, 2021, which claims priority to and the benefit of Korean Patent Application No. 10-2020-0061651, filed on May 22, 2020 in the Korean Intellectual Property Office, the entire contents of both of which are hereby incorporated by reference.

BACKGROUND

1. Field

Aspects of embodiments of the present disclosure relate to a display device and a method of fabricating a display device.

2. Description of the Related Art

Various display apparatuses are being developed for use in multimedia devices, such as televisions, mobile phones, tablet computers, navigation systems, gaming machines, and the like. A keyboard or a mouse may be used as an input device of the display device. In certain cases, an input sensor, such as a touch panel, is also used as the input device of the display device.

A variety of failures may occur in a process of fabricating a display device or in a display device fabricated by the process. Such a failure may occur in the input sensor.

SUMMARY

According to an aspect of embodiments of the inventive concept, a display device including an input sensor and a fabricating method thereof are provided.

According to another aspect of embodiments of the inventive concept, a display device, in which a failure rate is low, is provided.

According to another aspect of embodiments of the inventive concept, in a method of fabricating a display device, a failure may be prevented or substantially prevented from occurring when a display device is fabricated.

According to one or more embodiments of the inventive concept, a display device includes a display panel and an input sensor on the display panel. The input sensor may include an active region and a pad region adjacent to the active region. The input sensor may include a sensing electrode overlapped with the active region and configured to sense an input, a sensing pad overlapped with the pad region, and a sensing line electrically connecting the sensing electrode to the sensing pad. The sensing pad may include a pad portion and an edge portion, which is extended from the pad portion to an edge of the input sensor when viewed in a plan view. Each of the pad portion and the edge portion may include a first pad and a second pad, which is at least partially overlapped with the first pad. At least a portion of the second pad of the edge portion may be spaced apart from and may not be overlapped with the first pad of the edge portion, when viewed in a plan view.

In an embodiment, the edge portion may include a first portion, which is in a first region adjacent to the pad portion, and a second portion, which is in a second region extended from the first region to the edge of the input sensor. An end of the second portion may be aligned to the edge of the input sensor in a thickness direction of the input sensor.

In an embodiment, the first portion of the edge portion may include the first pad, a first insulating layer on the first pad, the second pad on the first insulating layer, and a second insulating layer on the second pad.

In an embodiment, the second insulating layer may cover all of the first pad, the first insulating layer, and the second pad.

In an embodiment, an end of the first insulating layer and an end of the first pad may be aligned to each other in a thickness direction of the display panel.

In an embodiment, the second portion may substantially include only the second pad, at least a portion of which is on the display panel and is exposed to an outside.

In an embodiment, the pad portion may further include a first insulating layer on the first pad and a second insulating layer on the second pad. A first contact hole may be defined in the first insulating layer to electrically connect the first pad to the second pad.

In an embodiment, a second contact hole may be defined in the second insulating layer to expose the second pad to an outside.

In an embodiment, the display panel may include a first base substrate, a second base substrate opposite to the first base substrate, a circuit device layer between the first base substrate and the second base substrate, and a light-emitting device layer on the circuit device layer.

In an embodiment, the first pad may be in contact with a top surface of the second base substrate.

In an embodiment, the second pad of the edge portion may include a plurality of second pads.

In an embodiment, the second pad of the pad portion may be overlapped with the first pad, and the second pad of the edge portion may not be overlapped with the first pad.

In an embodiment, the first pad may include a metallic material, and the second pad may include a transparent conductive oxide (TCO) material.

According to one or more embodiments of the inventive concept, a method of fabricating a display device may include: providing a display panel, in which a display region, a pad region, and a cutting region are defined; arranging an input sensor including a sensing pad, on the display panel; and cutting the display panel and the input sensor along the cutting region. The pad and cutting regions may be adjacent to the display region. The arranging the input sensor may include arranging a first pad, which is at least overlapped with the pad region and the cutting region, on the display panel, arranging a second pad on the first pad, and removing a portion of the first pad overlapped with the cutting region. The arranging the second pad may be performed such that the second pad is not overlapped with the first pad in the cutting region.

In an embodiment, the method may further include arranging an insulating layer, which is not overlapped with the cutting region and covers the first pad and the second pad. The arranging the insulating layer may be performed between the removing the portion of the first pad overlapped with the cutting region and the cutting the display panel along the cutting region.

In an embodiment, the removing of the portion of the first pad overlapped with the cutting region may include etching a portion of the first pad overlapped with the cutting region.

In an embodiment, the arranging the input sensor may further include arranging a first insulating layer on the first pad and arranging a second pad on the first insulating layer.

In an embodiment, the first insulating layer may not be overlapped with the cutting region, and the insulating layer may cover a portion of the first pad, which is different from the portion to be removed, when a portion of the first pad overlapped with the cutting region is etched.

In an embodiment, the input sensor may include a pad portion and an edge portion, which are overlapped with the pad region, and the edge portion may be adjacent to the cutting region.

In an embodiment, the arranging the second pad may be performed such that, in the edge portion, at least a portion of the second pad is not overlapped with the first pad.

BRIEF DESCRIPTION OF THE DRAWINGS

Embodiments will be more clearly understood from the following brief description of some example embodiments, taken in conjunction with the accompanying drawings. The accompanying drawings represent non-limiting, example embodiments as described herein.

Figure 1A:
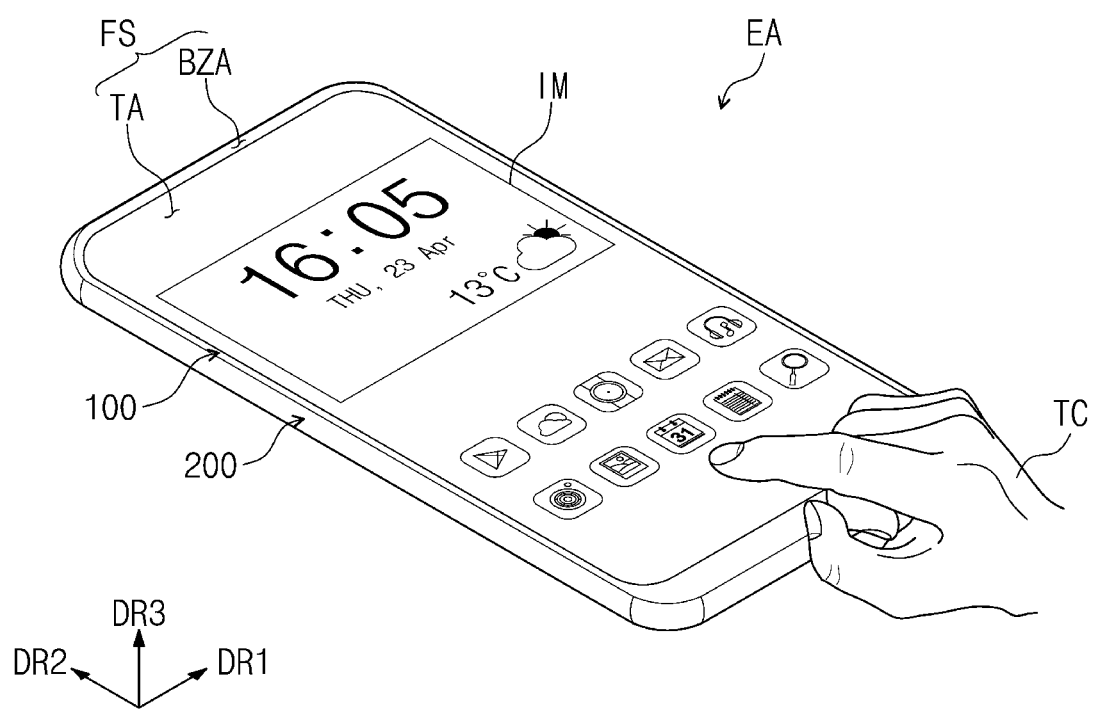
FIG. 1A is a perspective view illustrating a display device according to an embodiment of the inventive concept.

The figures are intended to illustrate the general characteristics of methods, structures, and/or materials utilized in certain example embodiments and to supplement the written description provided below. The drawings may not, however, be to scale and may not precisely reflect the structural or performance characteristics of any given embodiment, and should not be interpreted as limiting the range of values or properties encompassed by the example embodiments. For example, the relative thicknesses and positioning of components, layers, regions, and/or structural elements may be reduced or exaggerated for clarity. The use of similar or same reference numbers in the various drawings is intended to indicate the presence of a similar or same element or feature.

DETAILED DESCRIPTION

Embodiments of the inventive concepts will now be described more fully with reference to the accompanying drawings, in which some example embodiments are shown. Embodiments of the inventive concepts may, however, be embodied in many different forms and should not be construed as being limited to the example embodiments set forth herein; rather, these example embodiments are provided so that this disclosure will be thorough and complete, and will fully convey the concept of embodiments to those of ordinary skill in the art. In the drawings, the thicknesses of layers and regions may be exaggerated for clarity. Like reference numerals in the drawings denote like elements, and, thus, their repeated description may be omitted.

It is to be understood that when an element is referred to as being "connected" or "coupled" to another element, it may be directly connected or coupled to the other element or one or more intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other terms used to describe the relationship between elements or layers should be interpreted in a like fashion (e.g., "between" versus "directly between," "adjacent" versus "directly adjacent," and "on" versus "directly on").

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise. It is to be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Some example embodiments of the inventive concepts are described herein with reference to cross-sectional illustrations that may be schematic illustrations of idealized embodiments (and intermediate structures) of example embodiments. As such, variations from the shapes of the illustrations as a result, for example, of manufacturing techniques and/or tolerances, are to be expected. Thus, embodiments of the inventive concepts should not be construed as limited to the particular shapes of regions illustrated herein, but are to include deviations in shapes that result, for example, from manufacturing.

Unless otherwise defined, all terms (including technical and scientific terms) used herein have the same meaning as commonly understood by one of ordinary skill in the art to which embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

Figure 1B:
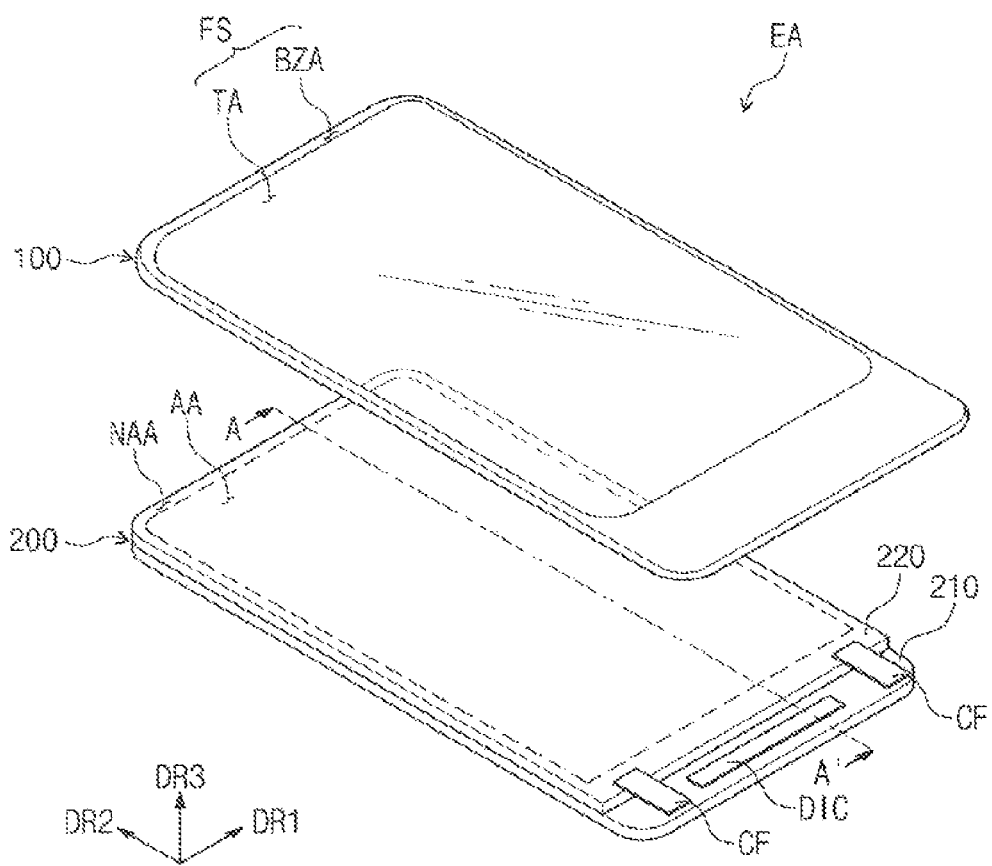
FIG. 1B is an exploded perspective view illustrating the display device of FIG. 1A.
Figure 1C:
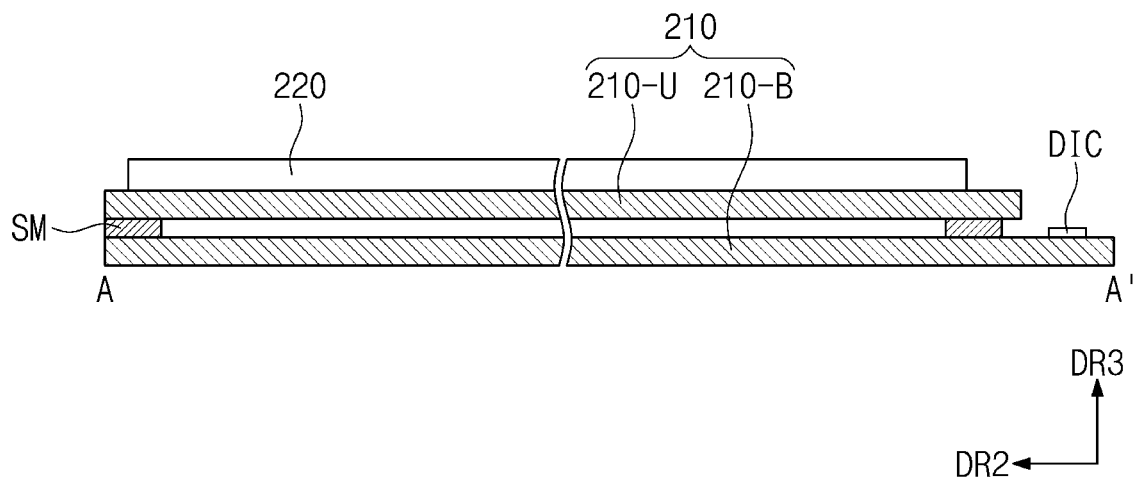
FIGS. 1C and 1D are cross-sectional views taken along the line A-A' of FIG. 1B.
Figure 1D:
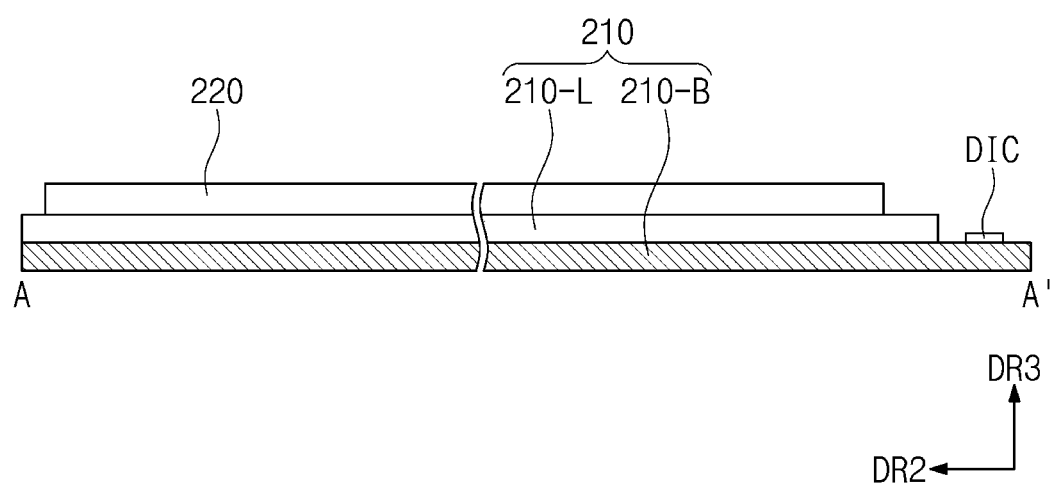

FIG. 1A is a perspective view illustrating a display device EA according to an embodiment of the inventive concept; FIG. 1B is an exploded perspective view of the display device EA of FIG. 1A; and FIGS. 1C and 1D are cross-sectional views taken along the line A-A' of FIG. 1B. Herein, the display device EA according to the present embodiment will be described in further detail with reference to FIGS. 1A to 1D.

The display device EA may be activated by an electrical signal. The display device EA may be realized in any of various forms. For example, the display device EA may include one of tablets, laptop computers, computers, smart televisions, and so forth. In the present embodiment, the display device EA may be a smartphone, as illustrated in FIGS. 1A and 1B.

The display device EA may include a display surface FS, which is used to display an image IM. The display surface FS may be parallel to a surface defined by a first direction DR1 and a second direction DR2. A direction normal to the display surface FS (e.g., a thickness direction of the display device EA) will be referred to as a third direction DR3. Herein, the third direction DR3 may be used to differentiate a front or top surface of each element from a back or bottom surface. Herein, the first to third directions DR1, DR2, and DR3 may be directions indicated by first to third direction axes, respectively, and will be identified with the same reference numbers.

The display surface FS, on which the image IM is displayed, may correspond to a front surface of the display device EA and a front surface FS of a window member 100. Herein, the display or front surface of the display device EA and the front surface of the window member 100 will be identified using the same reference number. As shown FIG. 1A, a clock icon and a plurality of application icons may be displayed as an example of the image IM.

The display device EA may include the window member 100 and an electronic panel 200. In an embodiment, although not shown, the display device EA may further include an optical member disposed between the window member 100 and the electronic panel 200. In an embodiment, the optical member may include a polarizer. In an embodiment, the optical member may include a color filter member reducing reflectance of an external light.

The window member 100 may include a base panel. For example, the base panel may be formed of at least one of glass, plastic, or a combination thereof. The front surface FS of the window member 100 may include a transmission region TA and a bezel region BZA. The transmission region TA may be an optically transparent region. For example, the transmission region TA may be a region, of which transmittance to a visible light is about 90% or higher.

The bezel region BZA may have relatively low optical transmittance, compared with the transmission region TA. The bezel region BZA may define a shape of the transmission region TA. In an embodiment, the bezel region BZA may be provided adjacent to the transmission region TA to enclose the transmission region TA. In an embodiment, the window member 100 may further include a light-blocking pattern, which is disposed on the base panel to define the bezel region BZA.

In an embodiment, the bezel region BZA may have a color (e.g., a predetermined color). The bezel region BZA may cover a peripheral region NAA of the electronic panel 200 and thus may prevent or substantially prevent the peripheral region NAA from being recognized by a user. However, the inventive concept is not limited to this example, and, in an embodiment, at least a portion of the bezel region BZA may be omitted from the window member 100.

The electronic panel 200 may be configured to display the image IM and to sense an external input TC. The image IM may be displayed on the front surface FS of the electronic panel 200. The front surface FS of the electronic panel 200 may include an active region AA and the peripheral region NAA. The active region AA may be a region that is activated by an electrical signal. The active region AA may be a region overlapped with pixels PX, which will be described with reference to FIG. 2B.

In the present embodiment, the active region AA may be used to display the image IM and to sense the external input TC. The active region AA may correspond to the transmission region TA, and the peripheral region NAA may correspond to the bezel region BZA. In the present specification, an expression "a region or portion corresponds to another region or portion" means that the two regions or portions are overlapped with each other, but, even in this case, they may not necessarily have the same area and/or the same shape.

In an embodiment, the electronic panel 200 may include a display panel 210, an input sensor 220, a driving circuit DIC, and a flexible circuit board CF. In an embodiment, a pair of the flexible circuit boards CF may be provided in the electronic panel 200, as shown in FIG. 1B.

The display panel 210 may produce substantially the image IM. The display panel 210 may be a light-emitting display panel. In an embodiment, the light-emitting display panel may be one of an organic light-emitting display panel, a quantum dot light-emitting display panel, and a micro LED light-emitting display panel. The panels may be classified according to a material to be used for a light emitting layer. A light emitting layer of the organic light-emitting display panel may include an organic luminescent material. A light emitting layer of the quantum dot light-emitting display panel may include quantum dots and/or quantum rods. A light emitting layer of the micro LED light-emitting display panel may include a plurality of micro LEDs. Herein, the organic light-emitting display panel will be described as an example of the display panel 210.

The input sensor 220 may sense an external input (e.g., a touch event) applied from the outside. In the present embodiment, the input sensor 220 may be a capacitive-type touch sensor, but the inventive concept is not limited to this example.

The driving circuit DIC may be disposed on the display panel 210. The driving circuit DIC may be mounted on the display panel 210. The driving circuit DIC may be electrically connected to the display panel 210 to provide electrical signals, which are used to operate the display panel 210, to the display panel 210.

The flexible circuit board CF may be electrically connected to the input sensor 220. In an embodiment, a sensing driving circuit may be mounted on the flexible circuit board CF. The flexible circuit board CF may electrically connect the input sensor 220 to the display panel 210 or to another flexible circuit board.

Referring to FIG. 1C, in an embodiment, the display panel 210 may include a display substrate 210-B, an encapsulation substrate 210-U, and a sealing element SM attaching the display substrate 210-B to the encapsulation substrate 210-U. The display substrate 210-B may include the pixels PX (see FIG. 2B) substantially producing the image. In an embodiment, the encapsulation substrate 210-U may hermetically seal the pixels PX to prevent or substantially prevent the pixels PX from being damaged by external moisture or the like.

The driving circuit DIC may be mounted on the display substrate 210-B. In an embodiment, the driving circuit DIC may be provided in the form of an integrated chip. However, the inventive concept is not limited to this example, and, in an embodiment, the driving circuit DIC may not be mounted on the display substrate 210-B.

In an embodiment, each of the display substrate 210-B and the encapsulation substrate 210-U may include a glass substrate serving as a base substrate thereof. In an embodiment, the display substrate 210-B may have an area larger than the encapsulation substrate 210-U. The driving circuit DIC may be disposed on an exposed region of the display substrate 210-B, which is not covered by the encapsulation substrate 210-U. However, the inventive concept is not limited to this example, and, in an embodiment, the display substrate 210-B and the encapsulation substrate 210-U may have substantially the same shape. An outer or top surface of the encapsulation substrate 210-U may serve as a base surface, on which the input sensor 220 is disposed.

The sealing element SM may include, for example, a frit. The frit is a ceramic adhesive material, which can be melted and solidified through a laser exposure process. In an embodiment, the frit may include 15-40 wt % $V_2O_5$, 10-30 wt % $TeO_2$, 1-15 wt % $P_2O_5$, 1-15 wt % BaO, 1-20 wt % ZnO, 5-30 wt % $ZrO_2$, 5-20 wt % $WO_3$, and 1-15 wt % BaO, which are used as a principal ingredient, and at least one of $Fe_2O_3$, CuO, MnO, $Al_2O_3$, $Na_2O$, or $Nb_2O_5$, which are used as an additive agent. If the frit is prepared to have the above composition, the frit may have a thermal expansion coefficient of $40\text{-}100 \times 10^{-7}/°$ C. and a glass transition temperature of 250° C.-400° C. The sealing element SM may be overlapped with the peripheral region NAA.

Referring to FIG. 1D, in an embodiment, the display panel 210 may include the display substrate 210-B and a thin encapsulation layer 210-L. In an embodiment, the thin encapsulation layer 210-L may hermetically seal a display device layer 210-OLED (see FIG. 2A). In an embodiment, the thin encapsulation layer 210-L may include at least one inorganic layer. In an embodiment, the thin encapsulation layer 210-L may include a plurality of inorganic layers and a plurality of organic layers. In an embodiment, the thin encapsulation layer 210-L may have a structure in which an inorganic layer, an organic layer, and an inorganic layer are stacked. The topmost layer of the thin encapsulation layer 210-L may serve as a base surface, on which the input sensor 220 is disposed. Herein, the technical features of the display panel 210 will be described based on the display panel 210 of FIG. 1C.

Figure 2A:
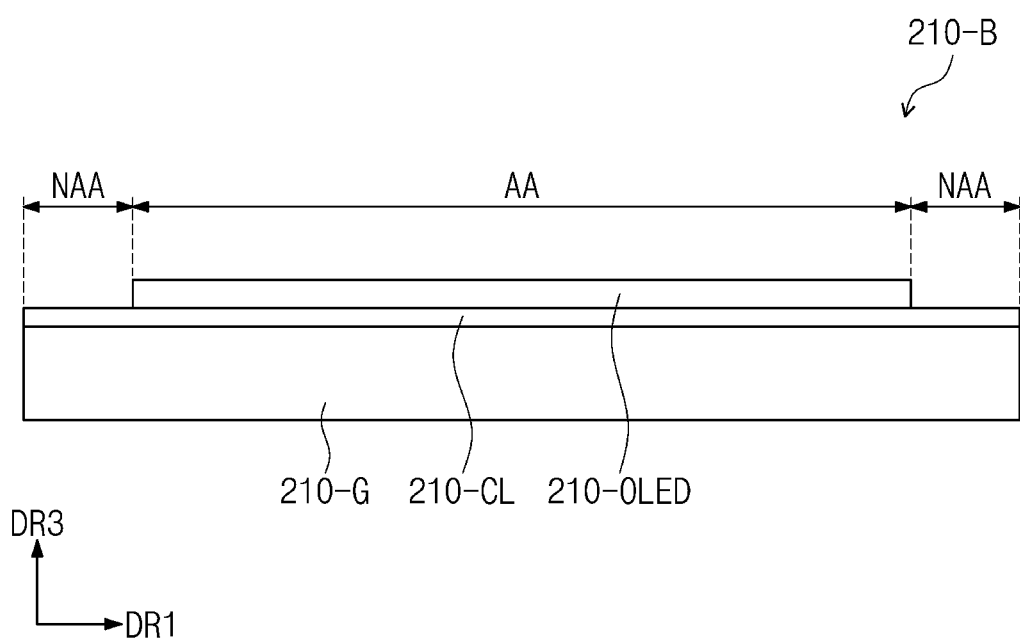
FIG. 2A is a cross-sectional view illustrating a display substrate according to an embodiment of the inventive concept.
Figure 2B:
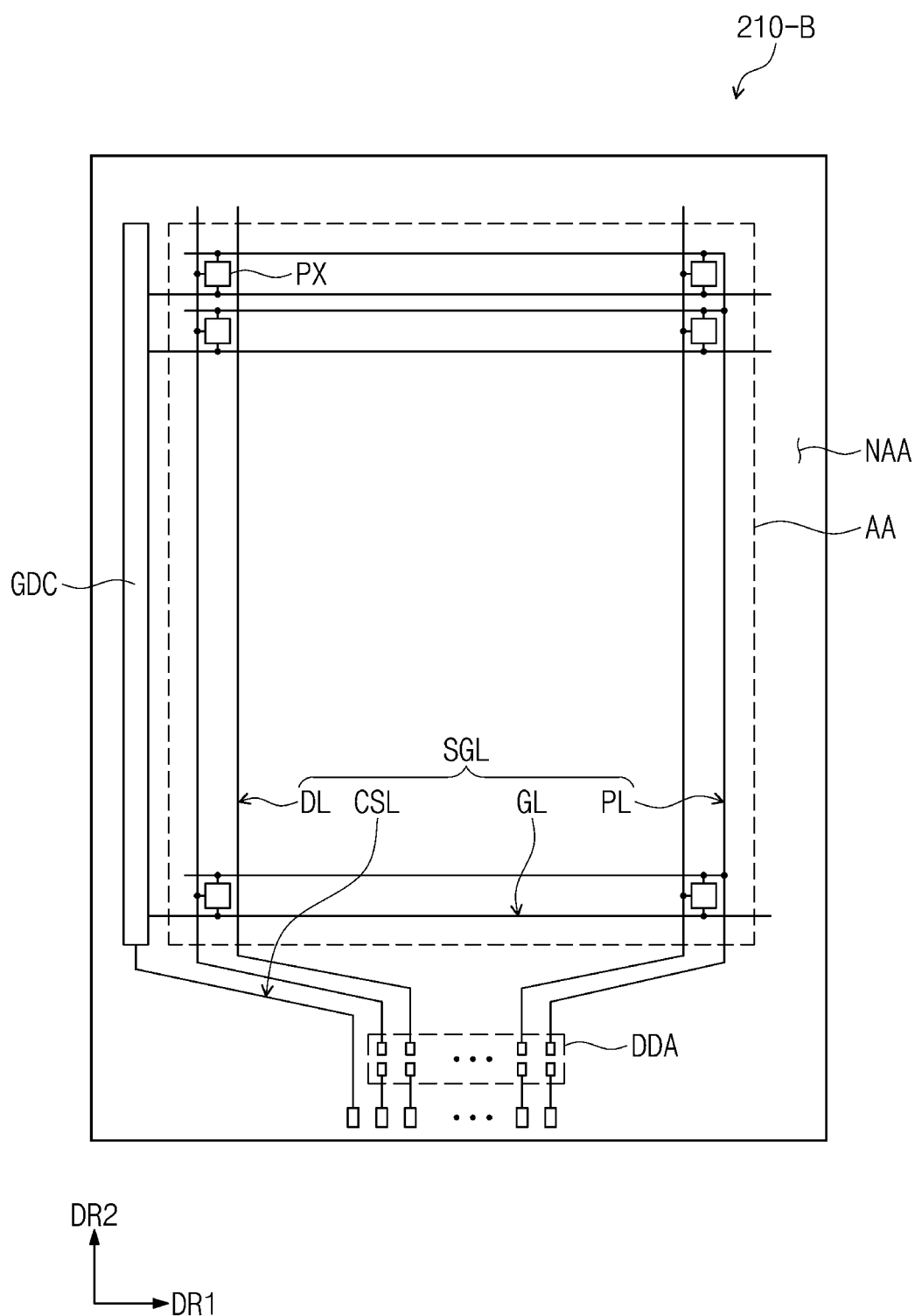
FIG. 2B is a plan view illustrating a display substrate according to an embodiment of the inventive concept.

FIG. 2A is a cross-sectional view illustrating the display substrate 210-B according to an embodiment of the inventive concept; and FIG. 2B is a plan view illustrating the display substrate 210-B according to an embodiment of the inventive concept. Herein, the display substrate 210-B according to an embodiment of the inventive concept will be described with reference to FIGS. 2A and 2B.

As shown in FIG. 2A, the display substrate 210-B may include a base substrate 210-G (herein, a first base substrate), a circuit device layer 210-CL disposed on a top or inner surface of the first base substrate 210-G, and a display device layer 210-OLED disposed on the circuit device layer 210-CL. The display substrate 210-B may further include an insulating layer covering the display device layer 210-OLED.

In an embodiment, the first base substrate 210-G may include a glass substrate, a metal substrate, or a substrate made of an organic/inorganic composite material. The circuit device layer 210-CL may include at least one insulating layer and a circuit device. The insulating layer may include at least one inorganic layer and at least one organic layer. The circuit device may include sensing lines, a pixel driving circuit, or the like. The display device layer 210-OLED may include at least organic light emitting diodes serving as its emission elements. The display device layer 210-OLED may further include an organic layer, such as a pixel definition layer.

As shown in FIG. 2B, the display substrate 210-B may include a driving circuit GDC, a plurality of sensing lines SGL, and a plurality of pixels PX.

The driving circuit GDC may include a scan driving circuit. The scan driving circuit may generate a plurality of scan signals and sequentially output the scan signals to a plurality of scan lines GL, which will be described below. In addition, the scan driving circuit may output other control signals to a driving circuit of the pixel PX.

The scan driving circuit may include a plurality of transistors, which may be formed by the same method as that for the driving circuit of the pixels PX or, for example, by a low-temperature polycrystalline silicon (LTPS) process and/or a low-temperature polycrystalline oxide (LTPO) process.

The sensing lines SGL may include the scan lines GL, data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX. The control signal line CSL may be used to provide control signals to the scan driving circuit.

As shown in FIG. 2B, the display substrate 210-B may include a mounting region DDA, in which the driving circuit DIC (see FIG. 1C) is disposed. The driving circuit DIC may be connected to the data lines DL.

Figure 3:
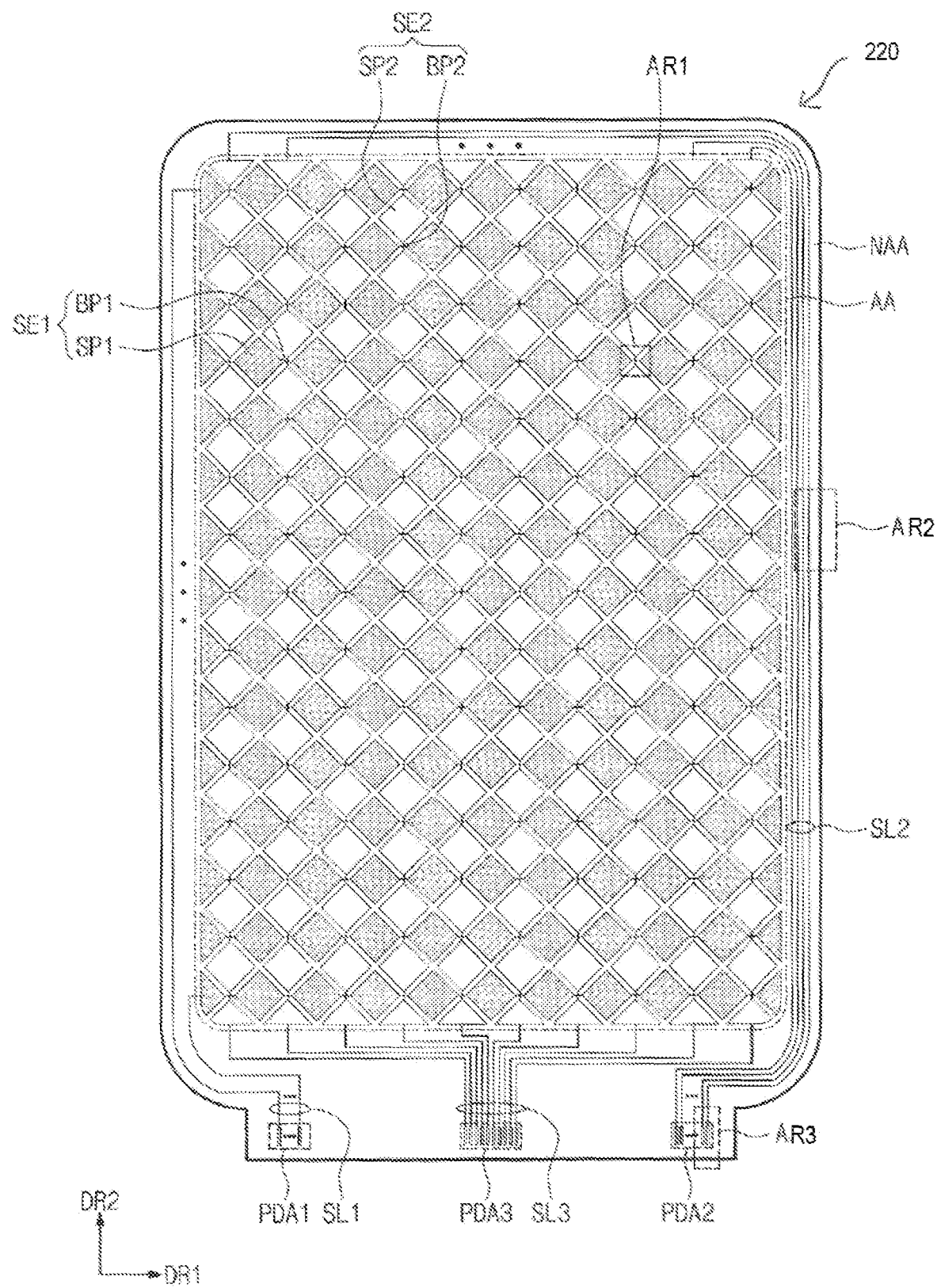
FIG. 3 is a plan view illustrating an input sensor according to an embodiment of the inventive concept.

FIG. 3 is a plan view of the input sensor 220 according to an embodiment of the inventive concept. The input sensor 220 may be disposed on the display panel 210 (see FIG. 1B). The input sensor 220 may include a plurality of sensing electrodes SE1 and SE2 and a plurality of sensing lines SL1, SL2, and SL3, which are connected to the sensing electrodes SE1 and SE2. The sensing electrodes SE1 and SE2 may be disposed in the active region AA. The sensing electrodes SE1 and SE2 may include a plurality of first sensing electrodes SE1 and a plurality of second sensing electrodes SE2, which are provided to cross each other. The first sensing electrodes SE1 may be extended in the first direction DR1 and may be arranged in the second direction DR2. Each of the first sensing electrodes SE1 may include a plurality of first sensing portions SP1 and a plurality of first intermediate portions BP1, which are arranged in the first direction DR1.

The second sensing electrodes SE2 may be extended in the second direction DR2 and may be arranged in the first direction DR1. Each of the second sensing electrodes SE2 may include a plurality of second sensing portions SP2 and a plurality of second intermediate portions BP2, which are arranged in the second direction DR2.

The sensing lines SL1, SL2, and SL3 may be disposed in the peripheral region NAA. The sensing lines SL1, SL2, and SL3 may include a plurality of first sensing lines SL1, a plurality of second sensing lines SL2, and a plurality of third sensing lines SL3.

The first sensing lines SL1 may be connected to ends of the first sensing electrodes SE1, respectively. The second sensing lines SL2 may be connected to ends of the second sensing electrodes SE2, respectively. The third sensing lines SL3 may be connected to opposite ends of the second sensing electrodes SE2, respectively. However, the inventive concept is not limited to this connection structure of the sensing electrodes SE1 and SE2 and the sensing lines SL1, SL2, and SL3.

Pad regions PDA1, PDA2, and PDA3 may be defined in the input sensor 220. The input sensor 220 may include sensing pads disposed in the pad regions PDA1, PDA2, and PDA3. In an embodiment, the pad region may include a first pad region PDA1, a second pad region PDA2, and a third pad region PDA3. The sensing pads, which are respectively disposed in the first to third pad regions PDA1, PDA2, and PDA3, may be connected to the first, second, and third sensing lines SL1, SL2, and SL3, respectively.

Figure 4A:
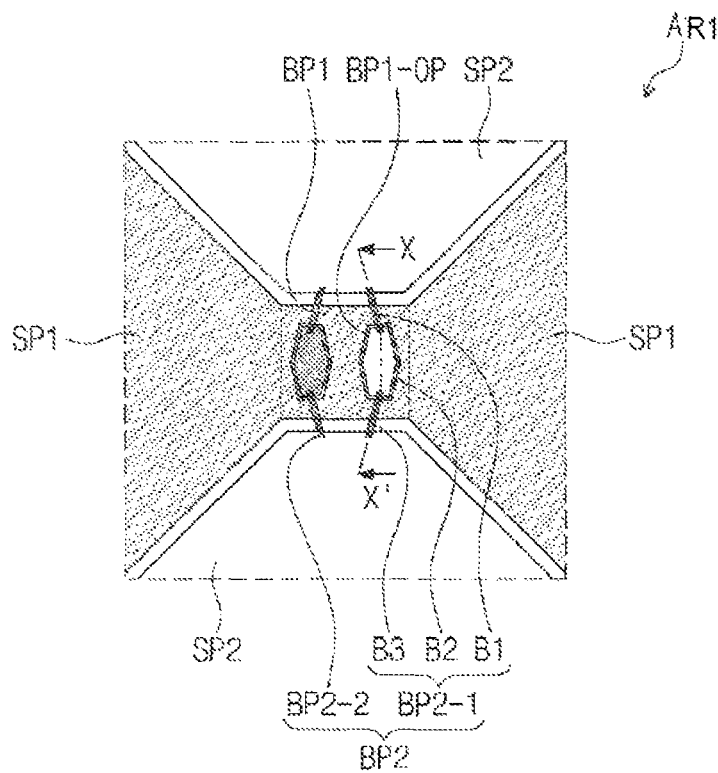
FIG. 4A is a plan view illustrating a region AR1 of FIG. 3.
Figure 4B:
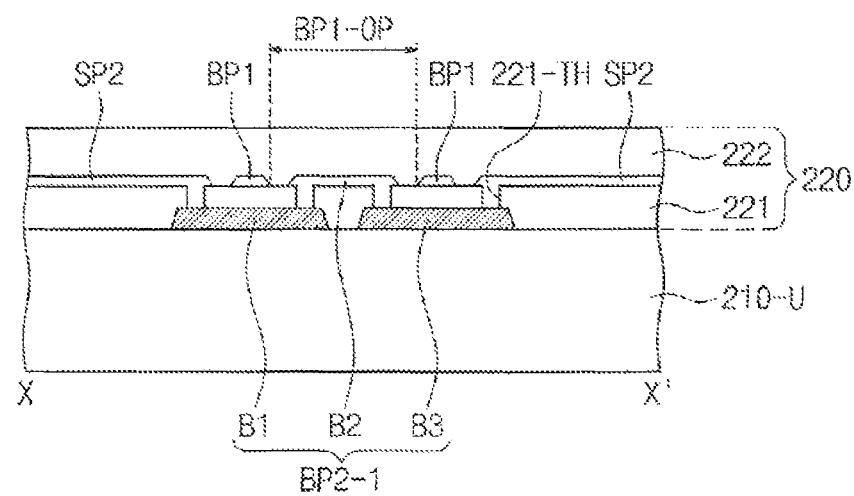
FIG. 4B is a cross-sectional view taken along the line X-X' of FIG. 4A.

FIG. 4A is a plan view illustrating a region AR1 of FIG. 3; and FIG. 4B is a cross-sectional view taken along the line X-X' of FIG. 4A. Herein, the input sensor 220 will be described in further detail with reference to FIGS. 4A and 4B, along with FIG. 3.

As shown in FIGS. 4A and 4B, the region AR1 may correspond to an intersection region of the first and second sensing electrodes SE1 and SE2. The first and second intermediate portions BP1 and BP2 may be disposed in the intersection region. In the present embodiment, the first sensing portion SP1 and the first intermediate portion BP1 may be provided as a single object, whereas the second sensing portion SP2 and the second intermediate portion BP2 may be provided as separated objects, but the inventive concept is not limited to this example. For example, in an embodiment, the first sensing portion SP1 and the first intermediate portion BP1 may be provided as separated objects, whereas the second sensing portion SP2 and the second intermediate portion BP2 may be provided as a single object.

In the case in which the sensing portion and the intermediate portion are not provided as a single object, they may be defined as an electrode pattern and a bridge pattern, respectively. For example, in the present embodiment, the second sensing electrode SE2 may include an electrode pattern SP2 and a bridge patterns BP2. Although two bridge patterns BP2-1 and BP2-2 are illustrated, as an example, to be disposed on one intersection region, the number of the bridge patterns is not limited to a specific number.

In the present embodiment, the bridge pattern BP2 may include a first portion B1, a second portion B2, and a third portion B3. The second portion B2 may be disposed on a layer different from that of the first portion B1 and the third portion B3. The second portion B2 may be disposed on the same layer as that of the electrode patterns SP2.

As shown in FIGS. 4A and 4B, the input sensor 220 may be directly disposed on an outer or top surface of the encapsulation substrate 210-U. In the present embodiment, the encapsulation substrate 210-U is illustrated, as an example, to include only a base substrate (herein, a second base substrate), but the inventive concept is not limited to this example. In the present embodiment, a portion of the bridge pattern BP2 is illustrated to be in contact with the top surface of the encapsulation substrate 210-U, but the inventive concept is not limited to this example.

In an embodiment, a buffer layer may be further disposed on the top surface of the encapsulation substrate 210-U, and a portion of the bridge pattern BP2 may be in contact with a top surface of the buffer layer. The buffer layer may include at least one of an inorganic layer or an organic layer.

In an embodiment, the input sensor 220 may not be directly disposed on the encapsulation substrate 210-U, and, here, an adhesive layer may be disposed between the input sensor 220 and the encapsulation substrate 210-U. A base layer of the input sensor 220 may be attached to the encapsulation substrate 210-U through the adhesive layer.

According to the present embodiment, at least a portion of the bridge pattern BP2 may be in contact with the top surface of the encapsulation substrate 210-U. The first portion B1 and the third portion B3 may be disposed on the top surface of the encapsulation substrate 210-U. In an embodiment, the first portion B1 and the third portion B3 may be formed of or include a metallic material. For example, the first portion B1 and the third portion B3 may be formed of or include at least one of titanium (Ti), aluminum (Al), copper (Cu), gold (Au), or silver (Ag). In an embodiment, the first portion B1 and the third portion B3 may be a multi-layered structure including a metal layer made of the metallic material.

A first insulating layer 221 may be disposed on the top surface of the encapsulation substrate 210-U. The first sensing electrode SE1, the electrode patterns SP2, and the second portion B2 may be disposed on the first insulating layer 221. An opening BP1-OP may be defined in the first intermediate portion BP1, and the second portion B2 may be provided in the opening BP1-OP. The electrode patterns SP2 and the second portion B2 may be connected to the bridge pattern BP2 through a penetration hole 221-TH penetrating the first insulating layer 221.

In an embodiment, the first sensing electrode SE1, the electrode patterns SP2, and the second portion B2 may be formed of or include a same material. For example, the first sensing electrode SE1, the electrode patterns SP2, and the second portion B2 may be formed of or include at least one of transparent conductive oxide (TCO) materials. In an embodiment, the first sensing electrode SE1, the electrode patterns SP2, and the second portion B2 may be formed of or include at least one of indium tin oxide (ITO), indium zinc oxide (IZO), zinc oxide (ZnO), or indium tin zinc oxide (ITZO), and, in an embodiment, may be formed of or include PEDOT, metal nano wires, or graphene.

A second insulating layer 222 may be disposed on the first insulating layer 221. The second insulating layer 222 may cover the first sensing electrode SE1, the electrode patterns SP2, and the second portion B2. Each of the first and second insulating layers 221 and 222 may be formed of or include at least one of inorganic and/or organic materials. Each of the first and second insulating layers 221 and 222 may have a single- or multi-layered structure.

In an embodiment, the bridge pattern BP2 may include only a metal pattern disposed on the top surface of the encapsulation substrate 210-U. The bridge pattern BP2 may not cross the first intermediate portion BP1. The bridge pattern BP2 may be overlapped with the first sensing portions SP1 to take a long path around the first intermediate portion BP1. Here, the second portion B2 may be disposed within the first sensing portion SP1.

Figure 5A:
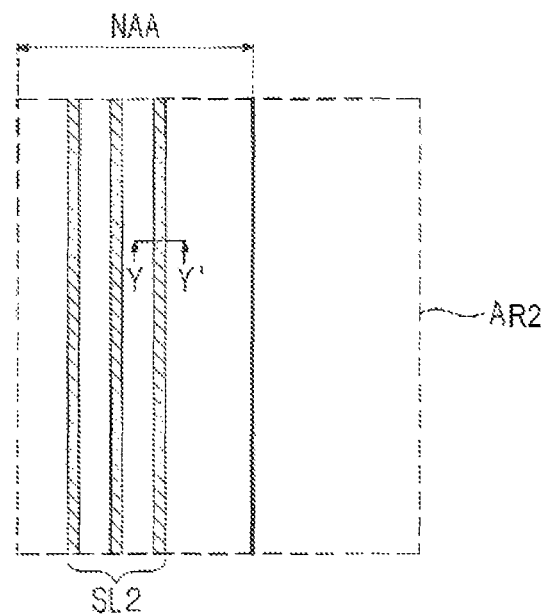
FIG. 5A is a plan view illustrating a region AR2 of FIG. 3.
Figure 5B:
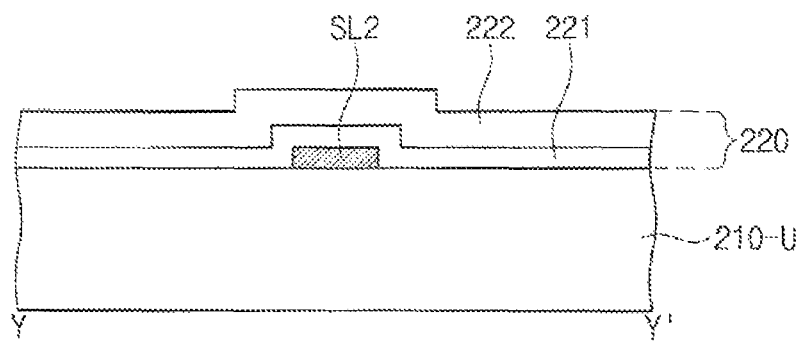
FIG. 5B is a cross-sectional view taken along the line Y-Y' of FIG. 5A.
Figure 6:
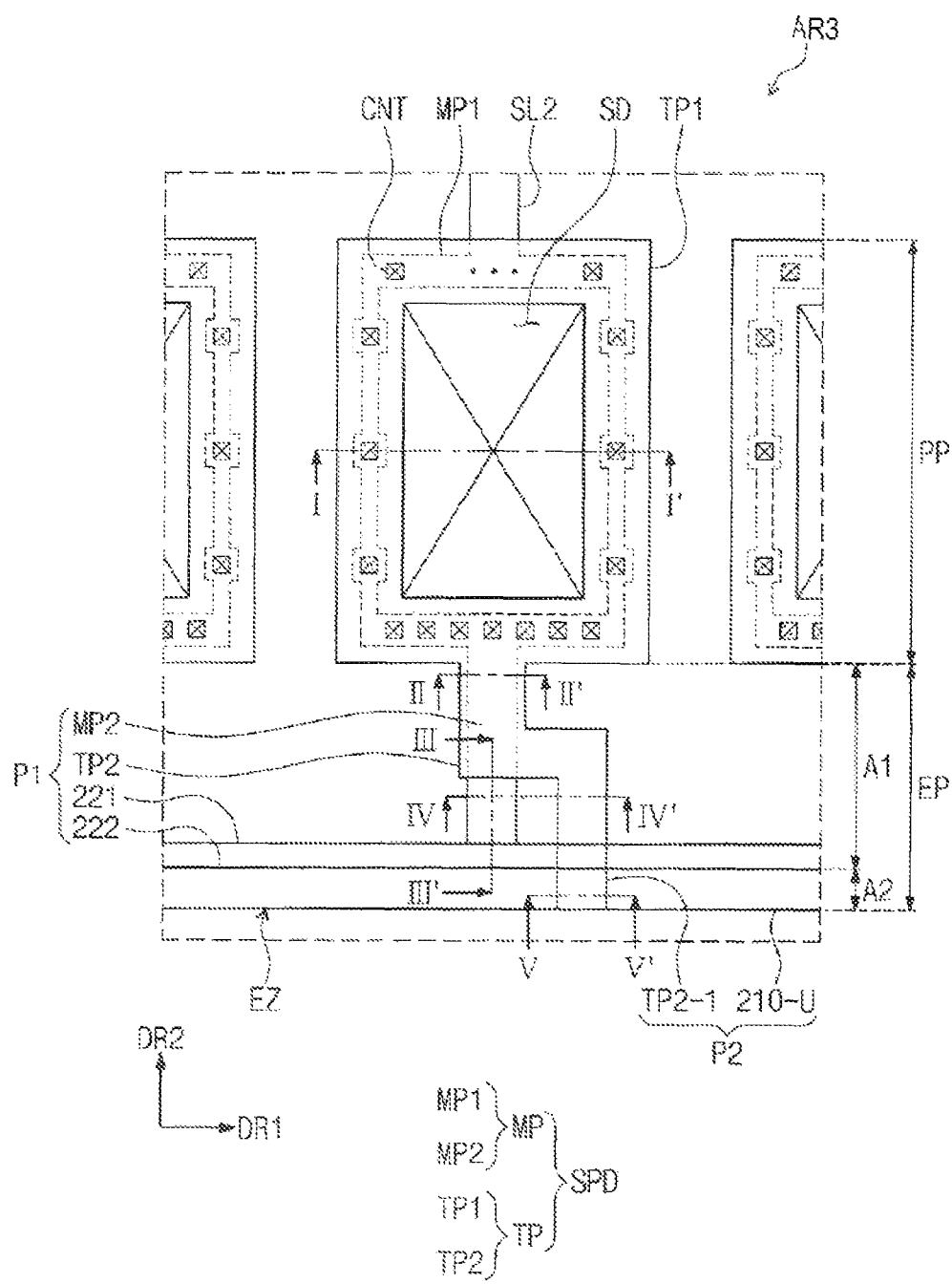
FIG. 6 is a plan view illustrating a region AR3 of FIG. 3.

FIG. 5A is a plan view illustrating a region AR2 of FIG. 3; and FIG. 5B is a cross-sectional view taken along the line Y-Y' of FIG. 5A. FIG. 6 is a plan view illustrating a region AR3 of FIG. 3. Herein, the input sensor 220 will be described in further detail with reference to FIGS. 5A, 5B, and 6, along with FIGS. 3, 4A, and 4B.

Referring to FIGS. 5A, 5B, and 6, the sensing lines SL1, SL2, and SL3 may be connected to sensing pads SPD. The sensing lines SL1, SL2, and SL3 may electrically connect the sensing electrodes SE1 and SE2 to the sensing pads SPD.

In FIGS. 5A and 5B, the second sensing line SL2, which is connected to the sensing pad SPD, will be illustrated, as an example. The second sensing line SL2 may be disposed on the encapsulation substrate 210-U. In an embodiment, an insulating layer may be disposed between the second sensing line SL2 and the encapsulation substrate 210-U. The first insulating layer 221 may be disposed on the second sensing line SL2, and the second insulating layer 222 may be disposed on the first insulating layer 221.

In an embodiment, the second sensing line SL2 may be formed by the same process as that for the first and third portions B1 and B3 of the bridge pattern BP2 and a first pad MP, and may include a same material as the first and third portions B1 and B3 and the first pad MP.

In an embodiment, the second sensing line SL2 and the sensing pad SPD may be provided as a single object. In an embodiment, unlike the structure shown in FIGS. 5A to 6, the second sensing line SL2 may have a same width as that of the sensing pad SPD.

As shown in FIG. 6, the input sensor 220 may include the sensing pad SPD. FIG. 6 illustrates, as an example, the second sensing line SL2 and the sensing pad SPD, which are disposed in the second pad region PDA2 (in particular, in the region AR3 of FIG. 3) and are connected to each other, but the inventive concept is not limited to this example. The sensing pad SPD may include a first pad MP and a second pad TP. The second pad TP may be disposed on the first pad MP. The second pad TP may be disposed on the first insulating layer 221 and may be connected to the first pad MP through a first contact hole CNT penetrating the first insulating layer 221. In an embodiment, the first pad MP may be formed of or include at least one of metallic materials. For example, the first pad MP may be formed of or include at least one of titanium (Ti), aluminum (Al), copper (Cu), gold (Au), or silver (Ag).

In an embodiment, the second pad TP may be formed by the same process as that for the first sensing electrode SE1, the electrode patterns SP2, and the second portion B2 and may be formed of or include a same material as the first sensing electrode SE1, the electrode patterns SP2, and the second portion B2. In an embodiment, the second pad TP may be formed of or include at least one of transparent conductive oxide (TCO) materials. In an embodiment, the second pad TP may be formed of or include at least one of indium tin oxide (ITO), indium zinc oxide (IZO), zinc oxide (ZnO), or indium tin zinc oxide (ITZO), and, in an embodiment, the second pad TP may be formed of or include PEDOT, metal nano wires, or graphene.

The sensing pad SPD may include a pad portion PP and an edge portion EP. The pad portion PP may be a portion electrically connected to the flexible circuit board CF, and the edge portion EP may correspond to a portion, which is extended from the pad portion PP to an edge EZ of the input sensor 220 (or the encapsulation substrate 210-U).

The pad portion PP may include a first pad MP1 and a second pad TP1, which are electrically connected to pads of the flexible circuit board CF through an anisotropic conductive film, solder balls, or the like. For example, the first pad MP1 of the pad portion PP may be connected to the sensing electrode through the second sensing line SL2 and may be electrically connected to the second pad TP1 of the pad portion PP through the first contact hole CNT. In an embodiment, a plurality of the first contact holes CNT may be provided. The second pad TP1 of the pad portion PP, along with the first pad MP1, may be electrically coupled to the pad of the flexible circuit board CF, through an anisotropic conductive film, a solder ball, or the like, in contact therewith.

The edge portion EP may include a first pad MP2 and a second pad TP2, which are extended from the pad portion PP to the edge EZ of the input sensor 220 (or the encapsulation substrate 210-U). The first pad MP2 of the edge portion EP may be extended from the first pad MP1 of the pad portion PP, and the second pad TP2 of the edge portion EP may be extended from the second pad TP1 of the pad portion PP. In an embodiment, the first pad MP2 of the edge portion EP and the first pad MP1 of the pad portion PP may be provided as a single object, and the second pad TP2 of the edge portion EP and the second pad TP1 of the pad portion PP may be provided as a single object. FIG. 6 illustrates an example in which the first and second pads MP2 and TP2 of the edge portion EP are provided to have widths smaller than the first pad MP1 and the second pad TP1 of the pad portion PP, but the inventive concept is not limited to this example. For example, the pads of the edge portion EP and the pad portion PP may be provided to have the same width.

In the pad portion PP, the second pad TP1 may be disposed on the first pad MP1, and the first pad MP1 may be covered with the second pad TP1. In the pad portion PP, the first pad MP1 may be overlapped with the second pad TP1.

In the edge portion EP, the second pad TP2 and the first pad MP1 may be spaced apart from each other when viewed in a plan view. In the edge portion EP, at least a portion of the second pad TP2 may be overlapped with the first pad MP2, and the remaining portion may not be overlapped with the first pad MP2. In other words, the second pad TP2 of the edge portion EP may be extended from the second pad TP1 of the pad portion PP and may include at least a portion, which is disposed in a detouring manner that it is not overlapped with the first pad MP2 of the edge portion EP. For example, the second pad TP2 of the edge portion EP may include first to third extension portions, which are sequentially connected to each other. The first extension portion may be extended from the pad portion PP in the second direction DR2 to be overlapped with a portion of the first pad MP2. The second extension portion may be extended in the first direction DR1 such that it is not overlapped with the first pad MP2 of the edge portion EP in a thickness direction, and the third extension portion may be extended to the edge EZ of the input sensor 220 in the second direction DR2, when viewed in a plan view, while maintaining a distance from the first pad MP2.

In an embodiment, the edge portion EP may include a first region A1 and a second region A2. The first region A1 may be adjacent to the pad portion PP, and the second region A2 may be adjacent to the edge EZ of the input sensor 220. The second region A2 may correspond to a region which is extended from the first region A1 to the edge EZ of the input sensor 220. The edge portion EP may include a first portion P1 and a second portion P2. The first portion P1 may be disposed in the first region A1, and the second portion P2 may be disposed in the second region A2. The first portion P1 may include the first pad MP2, the second pad TP2, the first insulating layer 221, and the second insulating layer 222, which are disposed on the encapsulation substrate 210-U. The second portion P2 may include the second pad TP2 disposed on the encapsulation substrate 210-U. In another embodiment, the second portion P2 may include the second pad TP2 and the second insulating layer 222 on the second pad TP2.

In an embodiment, an end of the second portion P2 may be aligned to the edge EZ of the input sensor 220 in a thickness direction of the input sensor 220. In further detail, a second pad TP2-1 of the second pad TP2 of the edge portion EP constituting the second portion P2 may be disposed on the encapsulation substrate 210-U and may be exposed to the outside, and an end of the second pad TP2-1 in the second direction DR2 may be aligned to the edge EZ in the thickness direction.

Figure 7A:
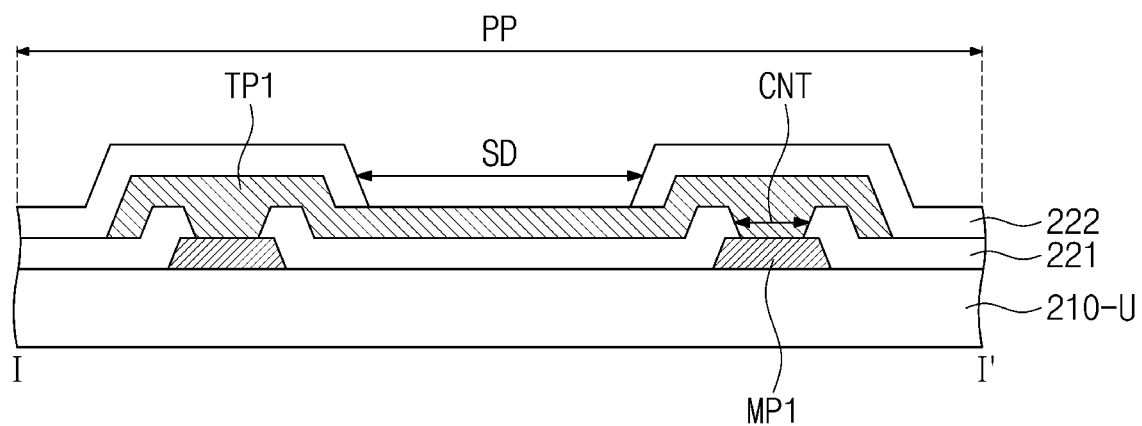
FIG. 7A is a cross-sectional view taken along the line I-I' of FIG. 6.
Figure 7B:
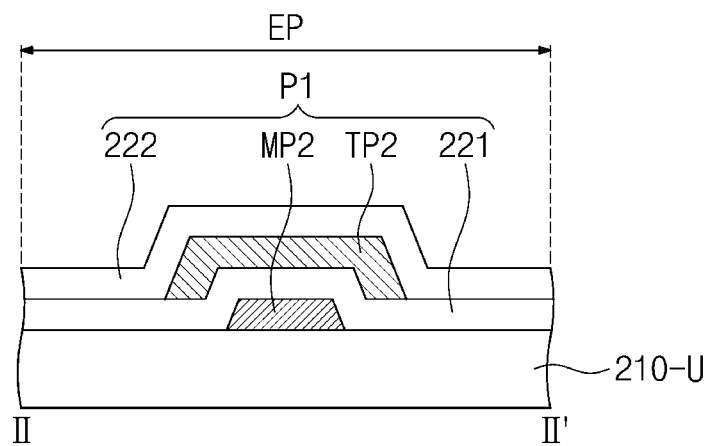
FIG. 7B is a cross-sectional view taken along the line II-II' of FIG. 6.
Figure 7C:
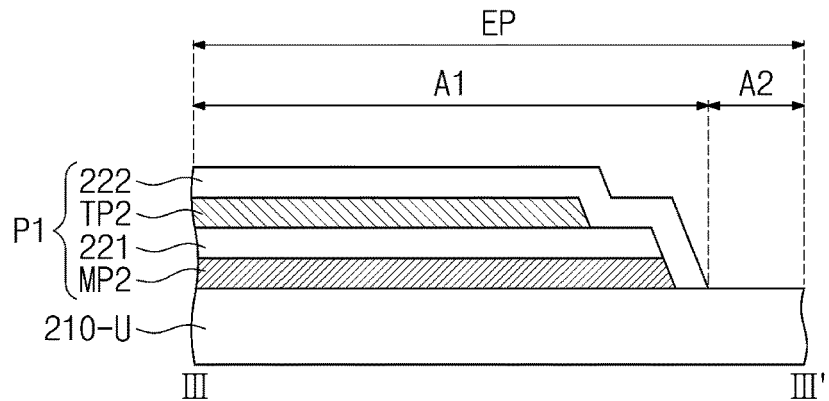
FIG. 7C is a cross-sectional view taken along the line III-III' of FIG. 6.
Figure 7D:
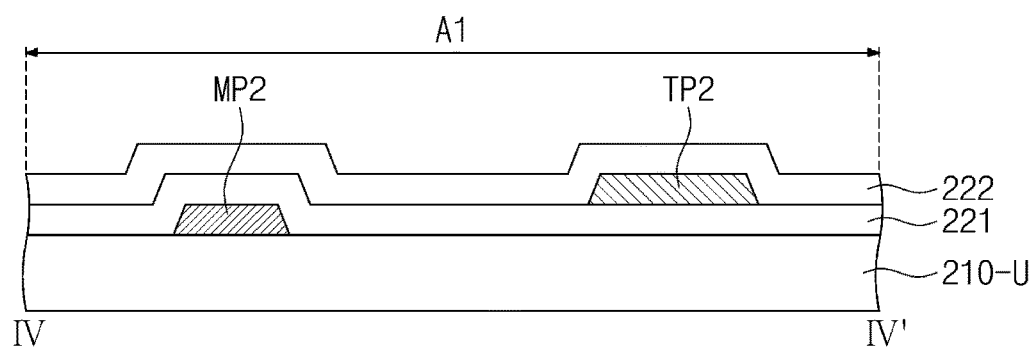
FIG. 7D is a cross-sectional view taken along the line IV-IV' of FIG. 6.
Figure 7E:
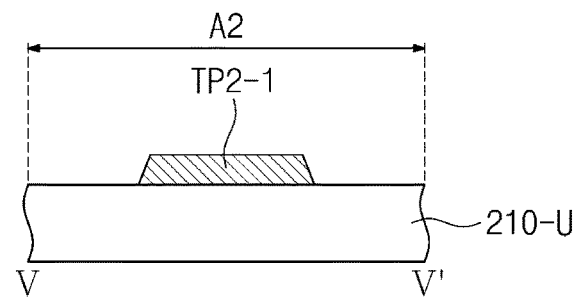
FIG. 7E is a cross-sectional view taken along the line V-V' of FIG. 6.

FIG. 7A is a cross-sectional view taken along the line I-I' of FIG. 6. FIG. 7B is a cross-sectional view taken along the line II-II' of FIG. 6. FIG. 7C is a cross-sectional view taken along the line III-III' of FIG. 6. FIG. 7D is a cross-sectional view taken along the line IV-IV' of FIG. 6. FIG. 7E is a cross-sectional view taken along the line V-V' of FIG. 6.

Referring to FIG. 7A, the pad portion PP of the sensing pad SPD (e.g., see FIG. 6) may be disposed over the encapsulation substrate 210-U. The first pad MP1 of the pad portion PP may be directly disposed on the encapsulation substrate 210-U. The first insulating layer 221 may be disposed on the first pad MP1, and the second pad TP1 may be disposed over the first insulating layer 221. The second insulating layer 222 may be disposed on the second pad TP1. The first contact hole CNT may be defined in the first insulating layer 221. The first pad MP1 and the second pad TP1 may be electrically connected to each other through the first contact hole CNT. A second contact hole SD may be defined in the second insulating layer 222. The second contact hole SD may be provided to expose the second pad TP1.

Referring to FIG. 7B, the edge portion EP of the sensing pad SPD (see FIG. 6) may be disposed on the encapsulation substrate 210-U. In an embodiment, each of the first pad MP2, the second pad TP2, and the first and second insulating layers 221 and 222 of the edge portion EP may be extended from a corresponding one of the first pad MP1, the second pad TP1, and the first and second insulating layers 221 and 222 of the pad portion PP to constitute a single object. FIG. 7B illustrates the first portion P1 of the edge portion EP. As shown in FIG. 7B, a portion of the second pad TP2 may be disposed to be overlapped with the first pad MP2.

Referring to FIG. 7C, in the first region µl of the edge portion EP of the sensing pad SPD (see FIG. 6), the second insulating layer 222 may cover all of the first pad MP2, the first insulating layer 221, and the second pad TP2. As shown in FIG. 7C, an end of the first insulating layer 221 may be substantially aligned to an end of the first pad MP2 in a thickness direction. The end of the first insulating layer 221 and the end of the first pad MP2, which are located near the end of the first portion P1 adjacent to the second portion P2, may be aligned to each other.

Referring to FIG. 7D, the first and second pads MP2 and TP2 may be disposed in the first region µl such that they are not overlapped with each other. When viewed in a plan view, the first and second pads MP2 and TP2 may be disposed to be spaced apart from each other.

Referring to FIG. 7E, the second portion P2 may include the second pad TP2-1 in the second region A2. As shown in FIG. 6, the second portion P2 of the sensing pad SPD may be configured to substantially include only the second pad TP2-1 in the second region A2.

FIGS. 8A to 8D are plan views illustrating a method of fabricating a display device, according to an embodiment of the inventive concept.

Referring to FIGS. 8A to 8D, a method of fabricating a display device may include providing a display panel, disposing an input sensor on the display panel, and cutting the display panel and the input sensor along a cutting region CTL. Each of the display panel and the input sensor may include a pad region and the cutting region CTL adjacent to the pad region. The input sensor may include the pad portion PP and the edge portion EP in the pad region. The edge portion EP may be adjacent to the cutting region CTL. Here, the cutting region CTL may correspond to a region, which will be cut in a cell process of cutting a mother substrate into a plurality of unit cells. This will be described in further detail with reference to FIGS. 9 and 10.

The disposing of the input sensor may include disposing the first pad MP2 on the display panel, disposing the second pad TP2 on the first pad MP2, and removing the first pad MP2 of the input sensor, which is overlapped with the cutting region CTL of the display panel.

The disposing of the second pad TP2 on the first pad MP2 may include disposing the second pad TP2 such that the first and second pads MP2 and TP2 are not overlapped with each other in the cutting region CTL. Thereafter, the disposing of the input sensor may include removing the first pad MP2 overlapped with the cutting region CTL. The first pad MP2 may not be overlapped with the second pad TP2 in the cutting region CTL and may be exposed to the outside. In an embodiment, the removing of the first pad MP2 in the cutting region CTL may include etching a portion of the first pad MP2 overlapped with the cutting region CTL.

In an embodiment, the disposing of the input sensor may further include disposing the first insulating layer 221 on the first pad MP2 and disposing the second pad TP2 on the first insulating layer 221. The first insulating layer 221 may be overlapped with a pad region of the first pad MP2. The first insulating layer 221 may not be overlapped with the cutting region CTL. Thus, the first pad MP2 may be exposed to the outside in the cutting region CTL and may be covered with the first insulating layer 221 in the pad region. During the etching of the portion of the first pad MP2 overlapped with the cutting region CTL, the first insulating layer 221 may cover a portion of the first pad MP2, which is different from the portion to be removed. In other words, the first insulating layer 221 may serve as a mask for etching the cutting region CTL or the first pad MP2 therein.

If the first pad MP2 is removed, only the second pad TP2, which is spaced apart from or non-overlapped with the removed first pad MP2, may be disposed in the cutting region CTL. The second pad TP2 may be cut when the input sensor is cut along the cutting region CTL. The cutting portion of the second pad TP2 may be exposed to the outside.

In an embodiment, the fabricating method may further include disposing the second insulating layer 222, which is overlapped with the cutting region CTL, but not with the pad region, and covers the first and second pads MP2 and TP2, and, here, the disposing of the second insulating layer 222 may be performed after the removing of the portion of the first pad MP2 overlapped with the cutting region CTL and before the cutting of the cutting region CTL of the input sensor. In another embodiment, the second insulating layer 222 may be overlapped with the cutting region CTL.

Figure 8A:
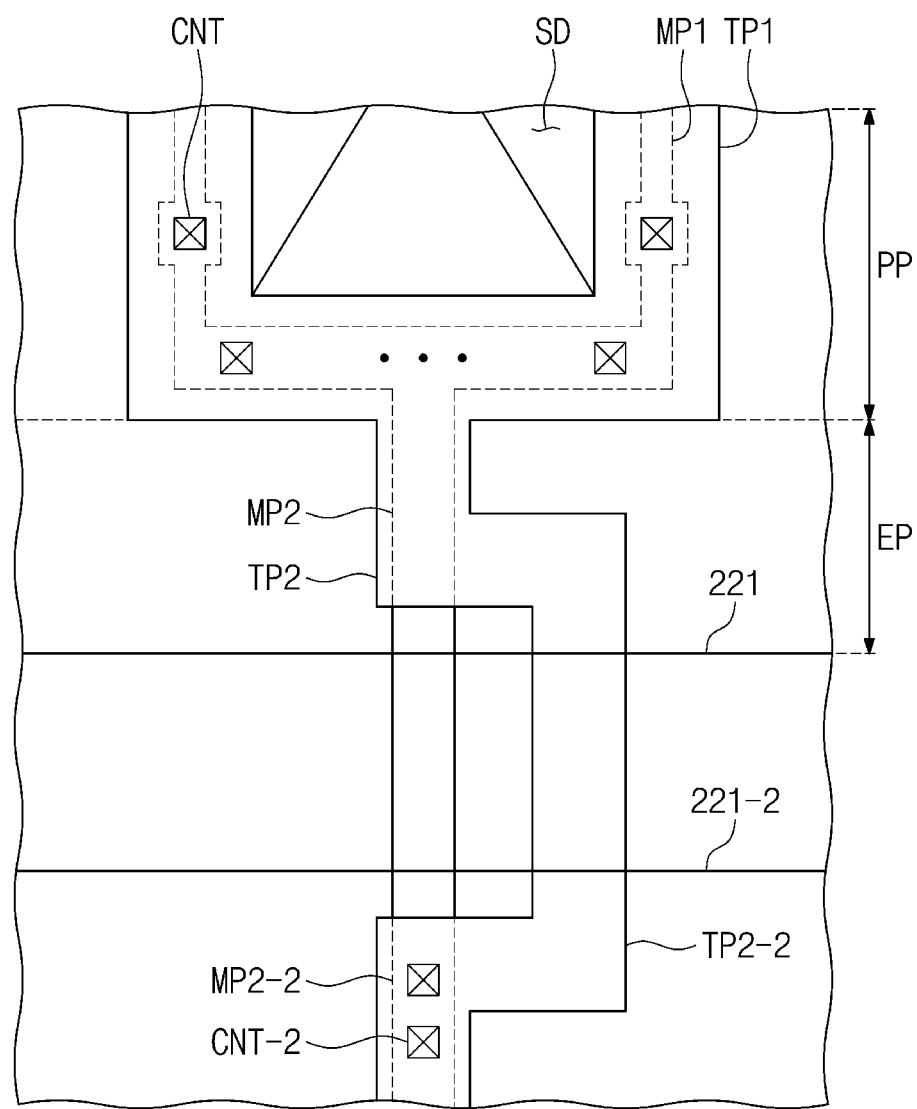
FIGS. 8A to 8D are plan views illustrating a method of fabricating a display device, according to an embodiment of the inventive concept.

As shown in FIG. 8A, the first and second pads MP2 and TP2 of the edge portion EP may include portions which are at least partially spaced apart from each other and are not overlapped with each other in the thickness direction when viewed in a plan view. The first insulating layer 221 may cover the edge portion EP of the first pad MP2. FIG. 8A illustrates a mother substrate (e.g., including adjacent unit cells connected to each other by the first and second pads MP2 and TP2) before the cell process. The first pad MP2 of the display device may be extended to a first pad MP2-2 of a neighboring unit cell, and the second pad TP2 may be bent to avoid an overlapping with the first pad MP2 and to be connected to a second pad TP2-2 of the neighboring unit cell. The second pads TP2 and TP2-2 may be connected to the first pads MP2 and MP2-2, respectively, through first contact holes CNT and CNT-2.

Figure 8B:
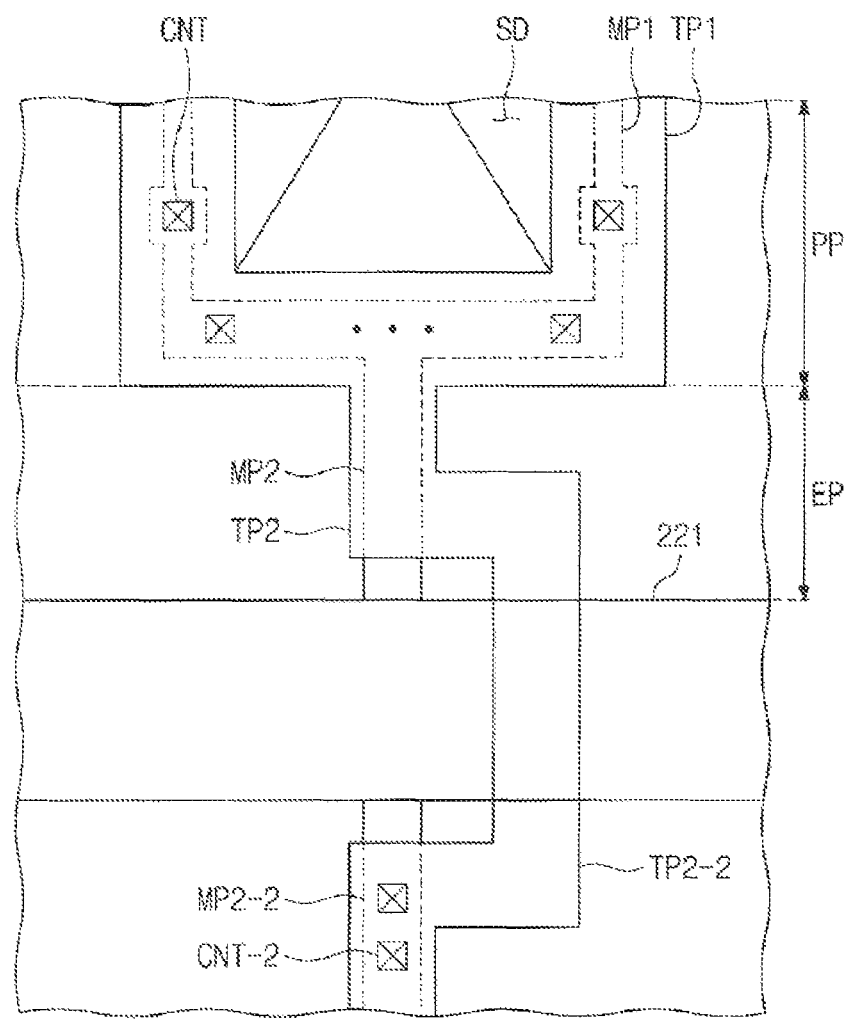

FIG. 8B illustrates a structure formed by removing the portion of the first pad MP2, which is not covered with the first insulating layer 221, by the etching process. In an embodiment, although the first pad MP2 is disconnected from the first pad MP2-2 of the neighboring unit cell, the second pads TP2 and TP2-2 may be connected to each other and the pad portion PP may be electrically connected to the pad portion of the neighboring unit cell through the first contact holes CNT and CNT-2. That is, the second pads TP2 and TP2-2 may be connected to each other, thereby functioning as a shorting bar.

Figure 8C:
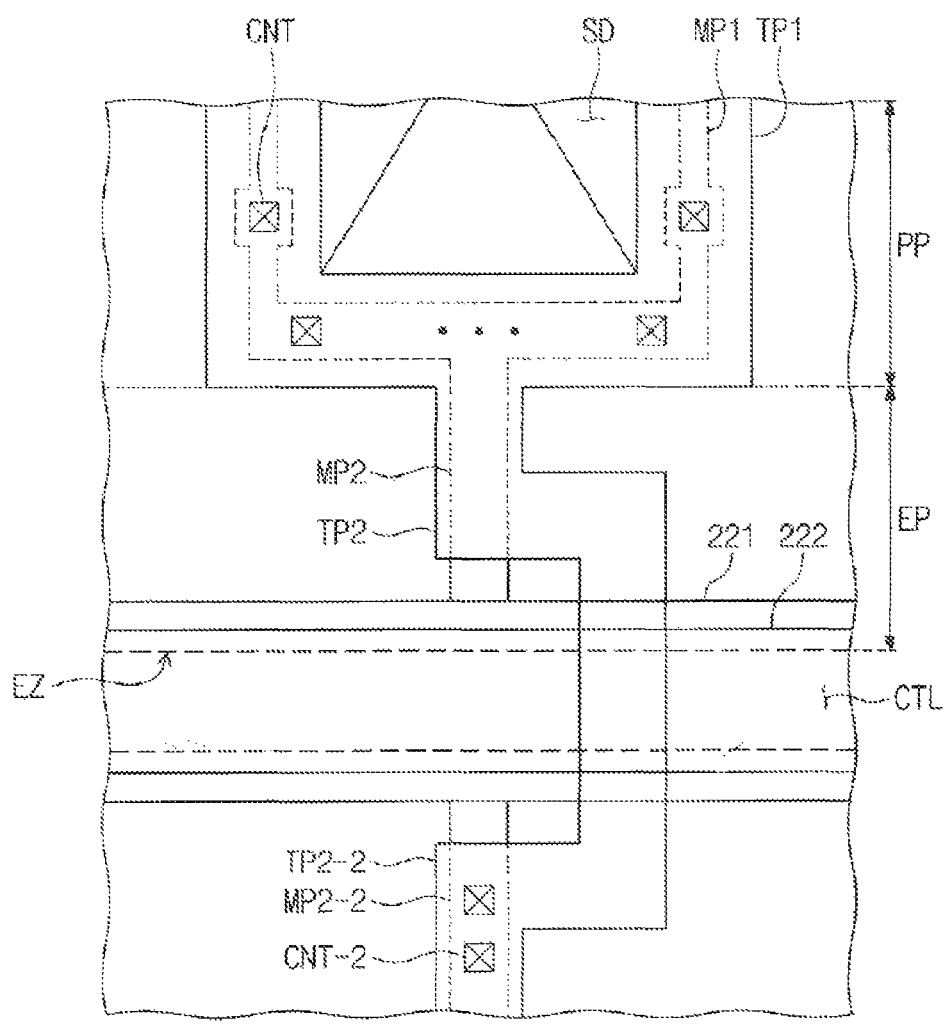
Figure 8D:
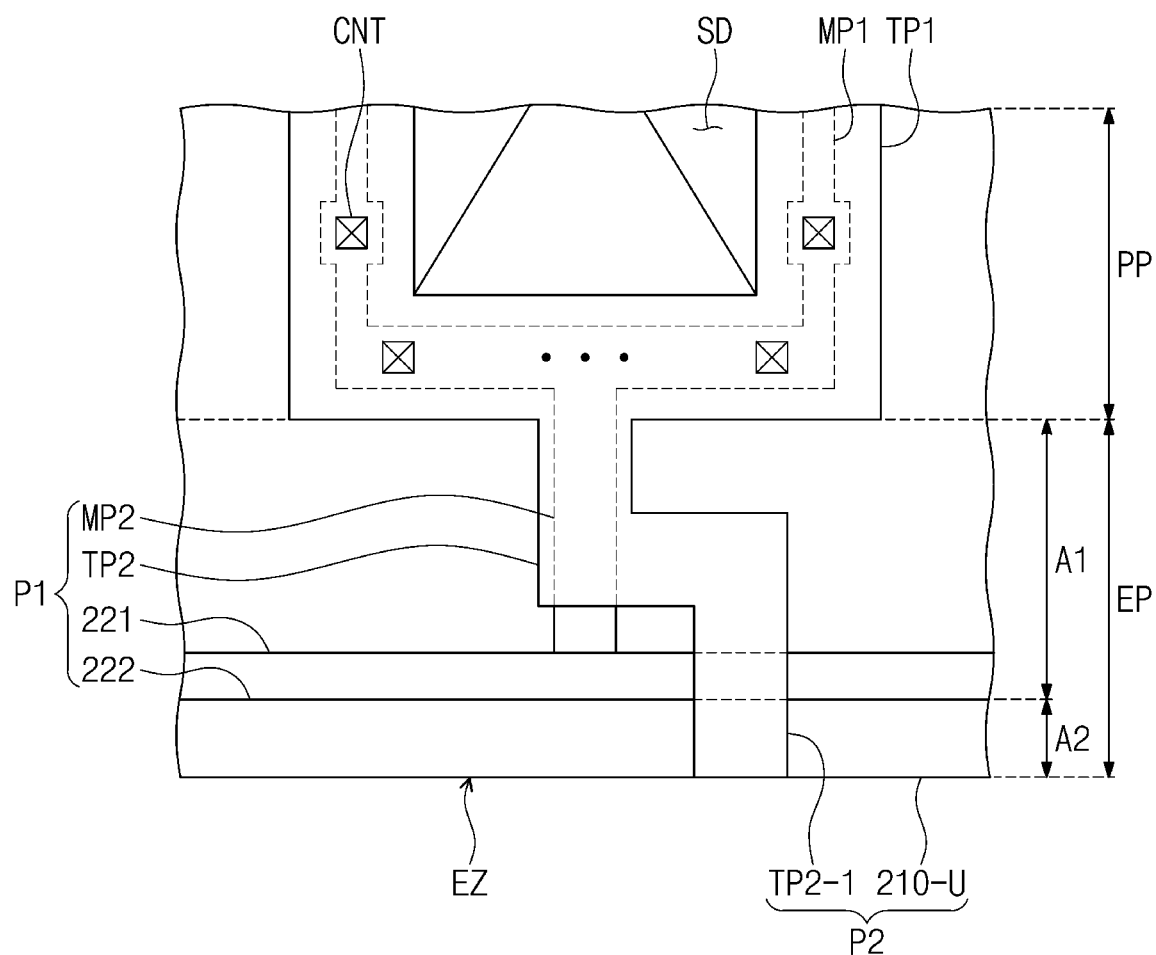

FIGS. 8C and 8D illustrate steps of disposing the second insulating layer 222 and cutting the cutting region CTL. The edge EZ of the input sensor may be formed by cutting the cutting region CTL. An end of the second pad TP2 aligned to the edge EZ may be exposed to the outside. Since the second pad TP2 is exposed to the outside in the edge EZ and the first pad MP2 was previously removed, the second pad TP2 may not be overlapped with the first pad MP2 near the edge EZ or in the cutting region CTL. Thus, in the input sensor according to an embodiment of the inventive concept, it may be possible to prevent or substantially prevent a corrosion issue, which is caused by the overlapping and exposing of the first and second pads MP2 and TP2, in the cutting region CTL and thereby to reduce a failure rate of the display device.

Figure 9:
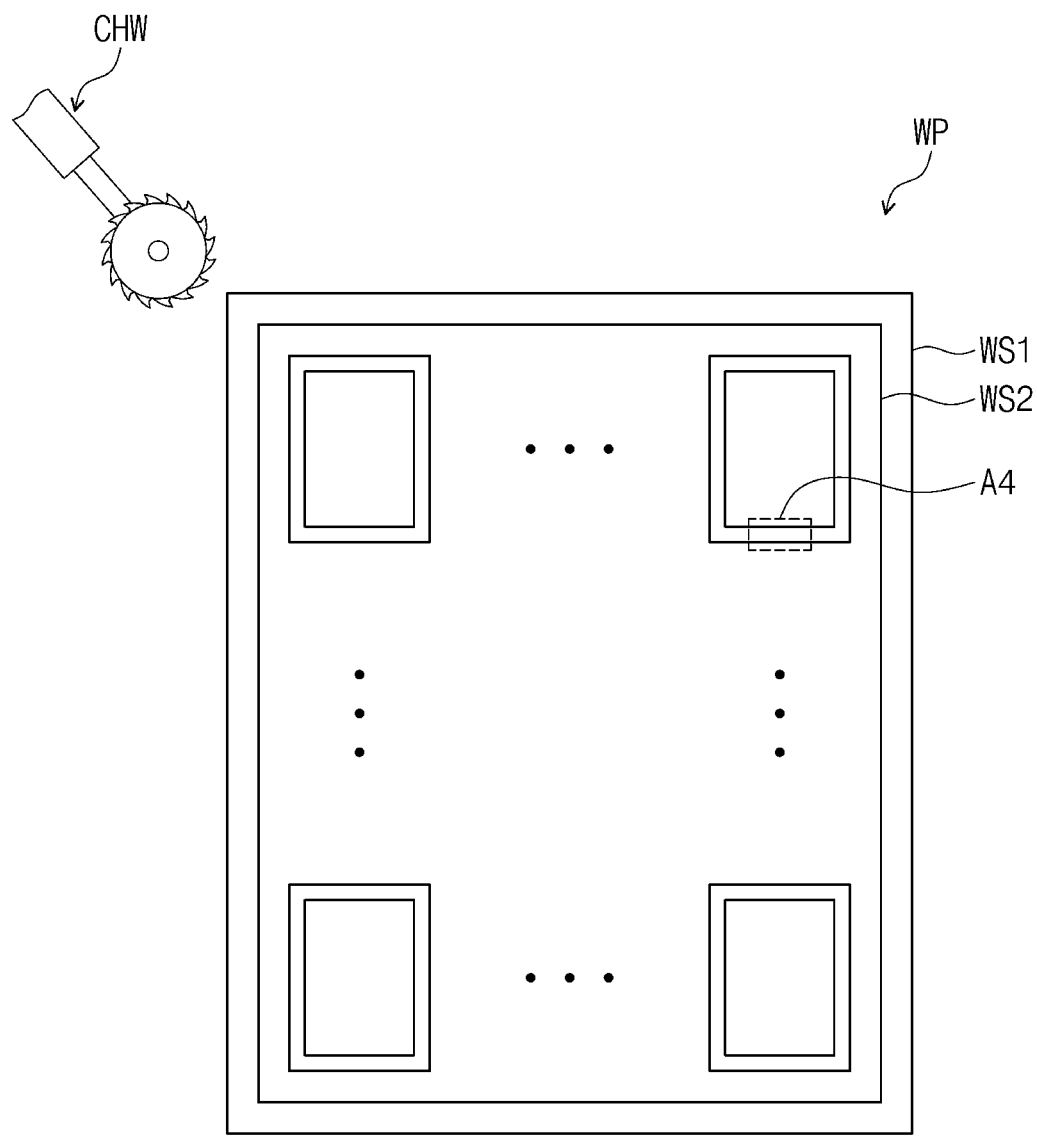
FIG. 9 is a plan view illustrating a method of fabricating a display device, according to an embodiment of the inventive concept.
Figure 10:
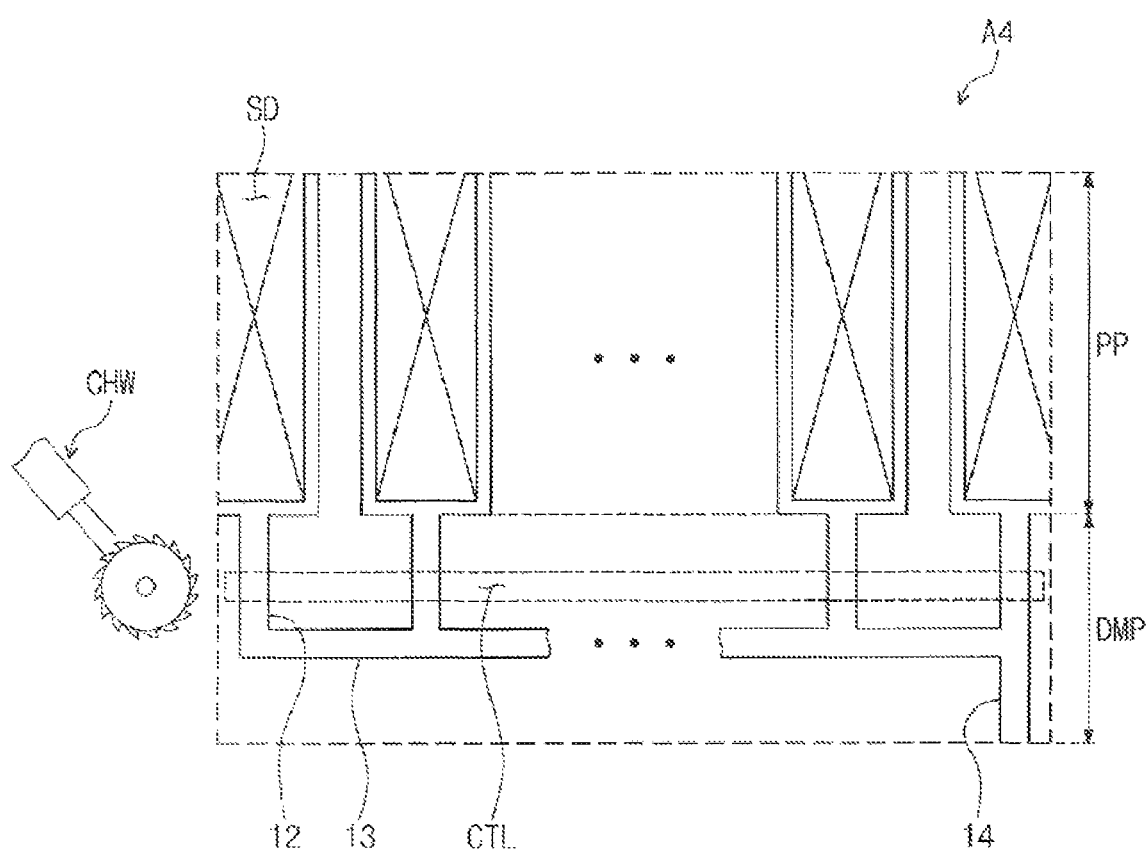
FIG. 10 is a plan view illustrating a method of fabricating a display device, according to an embodiment of the inventive concept.

FIG. 9 is a plan view illustrating a method of fabricating a display device, according to an embodiment of the inventive concept. FIG. 10 is a plan view illustrating a method of fabricating a display device, according to an embodiment of the inventive concept.

Referring to FIG. 9, a mother substrate WP may correspond to a working panel, which will be cut into a plurality of unit cells. The display device according to an embodiment of the inventive concept may be formed in each unit cell. A cutting wheel CHW may be used to cut the mother substrate WP into the unit cells. Here, the mother substrate WP may be formed by combining a first working substrate WS1 with a second working substrate WS2. One of the first and second working substrates WS1 and WS2 may be an encapsulation substrate, on which an input sensor is provided, and the other may correspond to a display substrate, in which pixels or the like are provided. A region A4 of FIG. 9 may include pad and cutting regions of a substrate in each unit cell.

FIG. 10 illustrates the pad and cutting regions in each unit cell of the mother substrate WP. Referring to FIG. 10, the cutting region CTL may be defined in a dummy portion DMP provided with dummy pads, which are extended from the pad portion PP and are connected to a neighboring unit cell. The dummy portion DMP may include an edge portion 12, which is extended from each pad of the pad portion PP and is overlapped with the cutting region CTL, a connecting portion 13, which connects the edge portions 12 of the pads to each other, and a shorting bar 14, which connects the connecting portions 13 of the unit cells to each other. The dummy portion DMP according to an embodiment of the inventive concept may include the second pad TP2 (see FIG. 6) provided on the encapsulation substrate. The second pad TP2 may function as a shorting bar, which connects the unit cells to each other through a contact hole. The shorting bar 14 may include the second pad TP2 (see FIG. 6). The unit cells may be connected to each other by the shorting bar 14, until a cell process is performed, and, thus, the display device may be prevented or substantially prevented from failing by an electrostatic discharging issue.

Figure 11A:
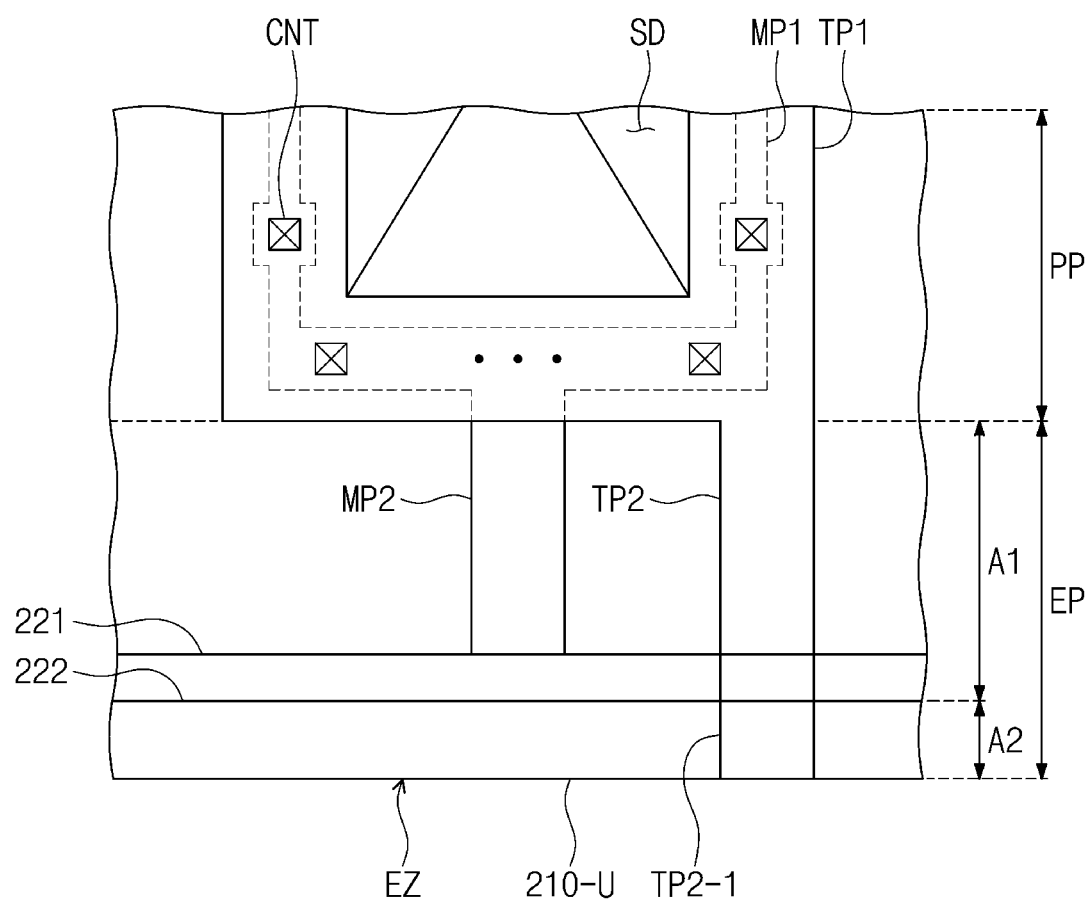
FIGS. 11A and 11B are plan views, each of which illustrates a pad region of a display device according to an embodiment of the inventive concept.
Figure 11B:
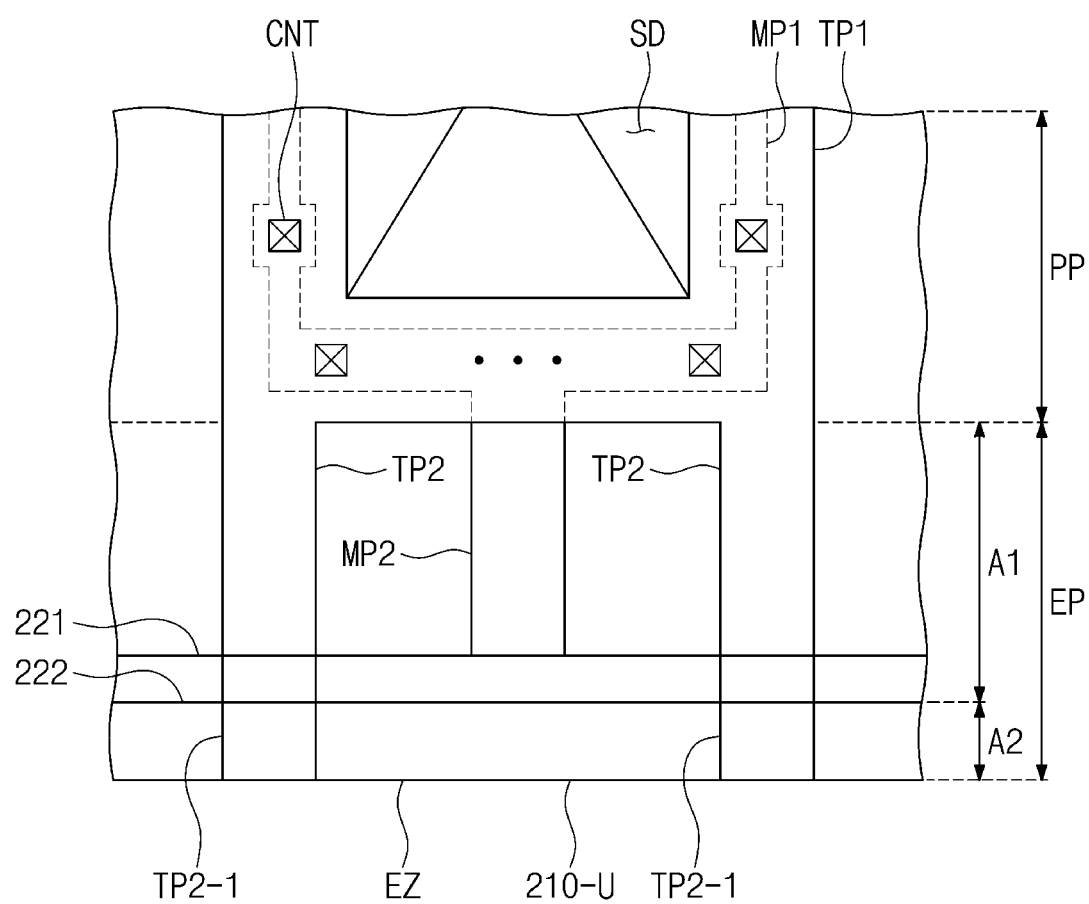

FIGS. 11A and 11B are plan views, each of which illustrates a pad region of a display device according to an embodiment of the inventive concept.

As shown in FIG. 11A, the first and second pads MP2 and TP2 of the edge portion EP may be extended from the pad portion PP and may be spaced apart from each other. For example, the first and second pads MP2 and TP2 of the edge portion EP may be disposed such that they are not fully overlapped with each other.

As shown in FIG. 11B, a plurality of the second pads TP2 may be extended from the second pad TP1 of the pad portion PP. Although FIG. 11B illustrates an example in which two second pads TP1 are provided, the inventive concept is not limited to this example. In an embodiment, all of the second pads TP2 of the edge portion EP may not be overlapped with the first pad MP2.

As shown in FIGS. 11A and 11B, in the second region A2 of the edge portion EP, at least one of the second pads TP2-1 may be aligned to the edge EZ. The first pad MP2 of the first region μl may be aligned to the first insulating layer 221.

According to embodiments of the inventive concept, a failure rate in an input sensor may be reduced. For example, a display device may be configured to prevent or substantially prevent corrosion from occurring in a pad region of the input sensor.

In addition, a corrosion-induced failure may be prevented or substantially prevented from occurring in the input sensor, during a process of fabricating a display device.

While some example embodiments of the inventive concept have been particularly shown and described, it will be understood by one of ordinary skill in the art that variations in form and detail may be made therein without departing from the spirit and scope of the inventive concept, as set forth in the attached claims.

What is claimed is:

1. A method of fabricating a display device, the method comprising:

providing a display panel, in which a display region, a pad region, and a cutting region are defined, the pad region being adjacent to the display region and being located between the display region and the cutting region;

arranging an input sensor comprising a sensing pad, on the display panel; and cutting the display panel and the input sensor along the cutting region, wherein the arranging the input sensor comprises:

arranging a first pad, which is at least overlapped with the pad region and the cutting region, on the display panel;

arranging a second pad on the first pad; and removing a portion of the first pad overlapped with the cutting region, wherein the arranging the second pad is performed such that the second pad is not overlapped with the first pad in the cutting region.

2. The method of claim 1, further comprising arranging an insulating layer, which is not overlapped with the cutting region and covers the first pad and the second pad, wherein the arranging the insulating layer is performed between the removing the portion of the first pad overlapped with the cutting region and the cutting the display panel along the cutting region.

3. The method of claim 1, wherein the removing the portion of the first pad overlapped with the cutting region comprises etching a portion of the first pad overlapped with the cutting region.

4. The method of claim 1, wherein the arranging the input sensor further comprises:

arranging a first insulating layer on the first pad; and arranging a second pad on the first insulating layer.

5. The method of claim 4, wherein the first insulating layer is not overlapped with the cutting region, and the insulating layer covers a portion of the first pad, which is different from the portion to be removed, when a portion of the first pad overlapped with the cutting region is etched.

6. The method of claim 1, wherein the input sensor comprises a pad portion and an edge portion, which are overlapped with the pad region, and the edge portion is adjacent to the cutting region.

7. The method of claim 6, wherein the arranging the second pad is performed such that, in the edge portion, at least a portion of the second pad is not overlapped with the first pad.

* * * * *